(12) United States Patent
Lo et al.

(10) Patent No.: US 11,876,077 B2
(45) Date of Patent: Jan. 16, 2024

(54) SEMICONDUCTOR DEVICE AND METHOD OF MANUFACTURING THE SAME

(71) Applicant: NANYA TECHNOLOGY CORPORATION, New Taipei (TW)

(72) Inventors: Yi-Jen Lo, New Taipei (TW); Hsih Yang Chiu, Taoyuan (TW); Ching Hung Chang, Taoyuan (TW); Chiang-Lin Shih, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/199,458

(22) Filed: Mar. 12, 2021

(65) Prior Publication Data

US 2022/0293561 A1   Sep. 15, 2022

(51) Int. Cl.
   *H01L 25/065*   (2023.01)
   *H01L 25/00*    (2006.01)
   *H01L 23/00*    (2006.01)

(52) U.S. Cl.
   CPC .......... *H01L 25/0657* (2013.01); *H01L 24/08* (2013.01); *H01L 24/89* (2013.01); *H01L 25/50* (2013.01); *H01L 2224/08146* (2013.01); *H01L 2224/80895* (2013.01); *H01L 2225/06541* (2013.01)

(58) Field of Classification Search
   CPC ..... H01L 25/0657; H01L 24/08; H01L 25/50; H01L 2224/08146; H01L 2224/80895; H01L 2225/06541; H01L 24/89
   See application file for complete search history.

(56) References Cited

U.S. PATENT DOCUMENTS

| | | | |
|---|---|---|---|
| 8,563,403 B1 * | 10/2013 | Farooq | H01L 21/8221 257/E21.597 |
| 8,802,538 B1 | 8/2014 | Liu et al. | |
| 10,811,402 B2 | 10/2020 | Chen et al. | |
| 2007/0169960 A1 * | 7/2007 | Hayashi | H05K 3/4046 174/262 |
| 2010/0264551 A1 * | 10/2010 | Farooq | H01L 25/50 438/109 |
| 2014/0308772 A1 * | 10/2014 | Lin | H01L 27/14621 438/65 |
| 2017/0338150 A1 | 11/2017 | Tseng et al. | |
| 2020/0161277 A1 * | 5/2020 | Lee | H01L 21/76898 |

(Continued)

FOREIGN PATENT DOCUMENTS

| | | |
|---|---|---|
| TW | 202042317 | 11/2020 |
| TW | 202107658 | 2/2021 |

OTHER PUBLICATIONS

"Office Action of Taiwan Counterpart Application", dated Dec. 16, 2021, pp. 1-9.

(Continued)

*Primary Examiner* — Thanh Y. Tran
(74) *Attorney, Agent, or Firm* — JCIPRNET

(57) ABSTRACT

The disclosure provides a method of manufacturing a semiconductor device including bonding a second device wafer to a first device wafer, such that a first bonding interface including a fusion-bonding interface is formed between the first device wafer and the second device wafer, wherein the first device wafer and the second device wafer are the same kind of device wafer. A semiconductor device is also provided.

9 Claims, 18 Drawing Sheets

(56) References Cited

U.S. PATENT DOCUMENTS

| | | |
|---|---|---|
| 2020/0258865 A1 | 8/2020 | Ho et al. |
| 2020/0350271 A1 | 11/2020 | Long et al. |
| 2022/0013523 A1* | 1/2022 | Cheng ................. H01L 21/2251 |
| 2022/0037256 A1* | 2/2022 | Shih .................. H01L 21/76877 |
| 2022/0059455 A1* | 2/2022 | Chen ....................... H01L 24/94 |
| 2022/0278074 A1* | 9/2022 | Chen ....................... H01L 24/05 |

OTHER PUBLICATIONS

"Office Action of Taiwan Counterpart Application", dated Feb. 16, 2023, p. 1-p. 12.

* cited by examiner

SEMICONDUCTOR DEVICE AND METHOD OF MANUFACTURING THE SAME

BACKGROUND

Technical Field

The disclosure relates to a device and method of manufacturing the same, and more particularly, to a semiconductor device and method of manufacturing the same.

DESCRIPTION OF RELATED ART

Generally, a stack technology provides advantages not only of an increase performance but also in regards to mounting density and mounting area utilization efficiency. Due to such advantages, research and development of stack technology has accelerated, such as ongoing efforts to increase density, and reduce costs.

SUMMARY

The disclosure provides a method of manufacturing a semiconductor device including bonding a second device wafer to a first device wafer, such that a first bonding interface including a fusion-bonding interface is formed between the first device wafer and the second device wafer, wherein the first device wafer and the second device wafer are the same kind of device wafer.

The disclosure provides a semiconductor device including a substrate, a first stacking, and a second stacking unit. A first stacking unit is disposed on the substrate and comprising a first dielectric layer and a first conductive component. A second stacking unit is disposed on the first stacking unit and comprising a second dielectric layer and a second conductive component, the first dielectric layer directly contacts the second dielectric layer, the first conductive component and a first portion of the second conductive component are separated by a distance and are electrically coupled by a second portion of the second conductive component. The semiconductor device is homogeneous in functionality.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
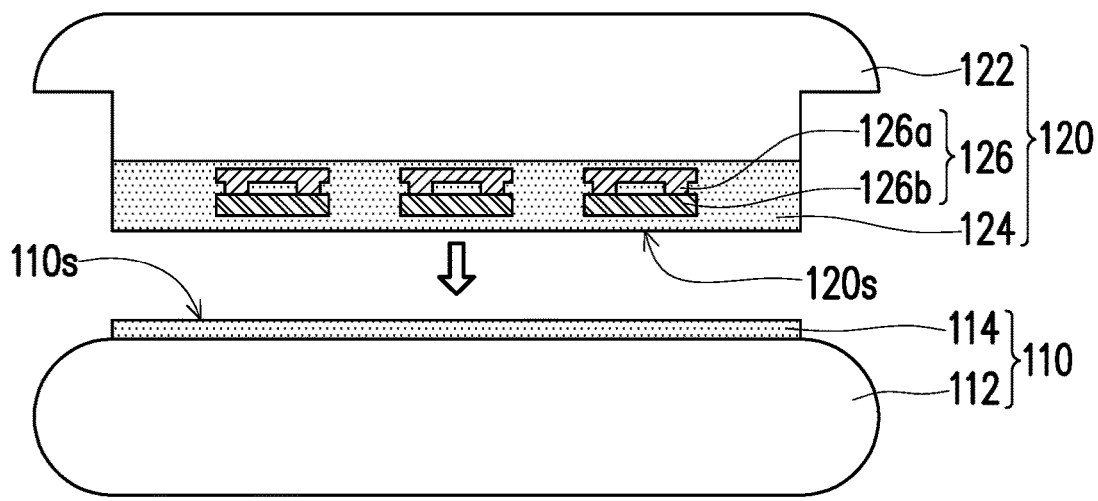
FIG. 1A to FIG. 1L are schematic cross sectional views illustrating various stages in a manufacturing method of a semiconductor device according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1A to FIG. 1L are schematic cross sectional views illustrating various stages in a manufacturing method of a semiconductor device according to some embodiments of the disclosure.

Referring to FIG. 1A, in the present embodiment, a manufacturing process of a semiconductor device 100 may include the following steps. A dummy wafer 110 and a first device wafer 120 are provided. In some embodiments, the dummy wafer 110 may have no circuit pattern, but the disclosure is not limited thereto. In addition, the dummy wafer 110 may have a substrate 112 and a dielectric material layer 114 formed on the substrate 112, wherein the substrate 112 may include silicon or other suitable material, and the dielectric material layer 114 may include a dielectric material, such as silicon nitride, silicon oxide, silicon carbon nitride or a combination thereof by any suitable method, such as CVD, ALD, or the like, but the disclosure is not limited thereto.

On the other hand, the first device wafer 120 may be a memory device wafer, such as a DRAM or the like, but the disclosure is not limited thereto. In addition, the first device wafer 120 may include a first substrate 122, a first dielectric layer 124 formed on the first substrate 122, and at least one first connector 126 (three is shown but not limited) formed on the first substrate 122 and surrounded by the first dielectric layer 124 to avoid current leakage. The first substrate 122 may be a doped bulk silicon, an undoped bulk silicon, or an active layer of a semiconductor-on-insulator (SOI) substrate, and may include various layers that are not separately depicted and that combine to form various microelectronic elements, doped regions and isolation features, not shown. The first dielectric layer 124 may include a dielectric material, such as silicon nitride, silicon oxide, silicon carbon nitride or a combination thereof by any suitable method, such as CVD, ALD, or the like, but the disclosure is not limited thereto. Moreover, the first connector 126 may include a conductive pattern 126a and a conductive pad 126b formed on the conductive pattern 126a, wherein the conductive pattern 126a and the conductive pad 126b are embedded in the first dielectric layer 124, such that only dielectric surface (a surface of the first dielectric layer 124) is exposed, but the disclosure is not limited thereto. In some embodiments, the conductive pattern 126a includes copper (Cu) or other suitable material, and the conductive pad 126b includes aluminum (Al) or other suitable material, but the disclosure is not limited thereto.

In some embodiments, for decreasing the breakage at the edge of substrate in the subsequent processes, a trimming process may be applied. For example, the trimming process is performed on the first substrate 122 to adjust a shape of the edge, therefore, the stress accumulated on a corner of the first substrate 122 will reduce in the subsequent processes, but the disclosure is not limited thereto.

Figure 1B:
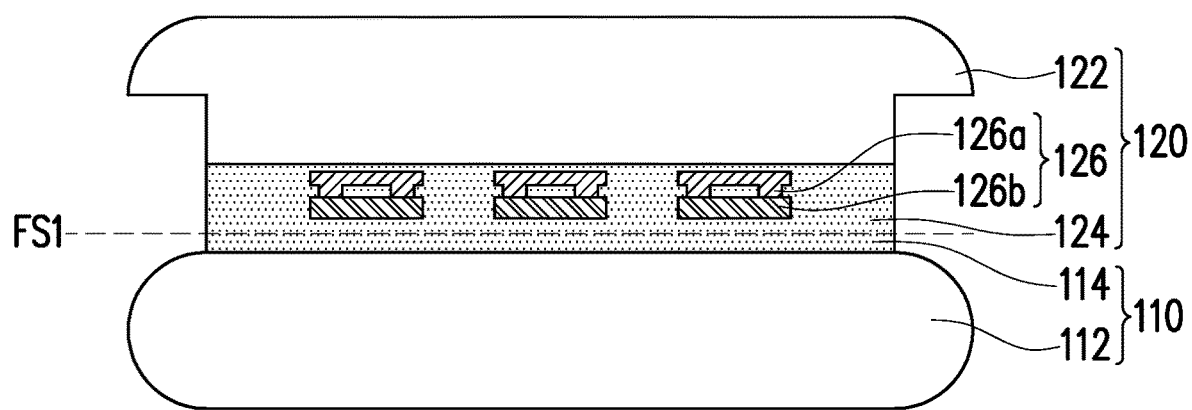

Referring to FIG. 1A and FIG. 1B, bonding the first device wafer 120 to the dummy wafer 110, such that a bonding interface FS1 including a fusion-bonding interface is formed between the dummy wafer 110 and the first device wafer 120. Moreover, the dummy wafer 110 may direct contact the first device wafer 120. For example, the dielectric material layer 114 directly contacts the first dielectric layer 124, that is, the bonding interface FS1 is formed by a portion of the dielectric material layer 114 and a portion of the first dielectric layer 124. In some embodiments, there is no metal-to-metal bonding interface between the dummy wafer 110 and the first device wafer 120, but the disclosure is not limited thereto.

In fusion bonding process, a surface of the dielectric layer is smooth and clean, therefore, before the fusion-bonding process, a polishing process or a cleaning process may be applied. For example, the cleaning process performs a wet clean to activate a surface 110s of the dummy wafer 110 and a surface 120s of the first device wafer 120 to form the hydrophilic surface and to clean the surface of the surface 110s (bonding surface) and the surface 120s (bonding surface), such as a metal particle or an impurity existing on the surface 110s and/or the surface 120s are removed, therefore, a bonding reliability will be improved, but the disclosure is not limited thereto.

In some embodiments, the material of the dielectric material layer 114 and the material of the first dielectric layer 124 are used the same material, such as oxide, therefore, bonding interface FS1 is formed by oxide-to-oxide bond, but the disclosure is not limited thereto. In some embodiments, the material of the dielectric material layer 114 and the material of the first dielectric layer 124 are not used the same material, for example, the material of the dielectric material layer 114 may use oxide, and the material of the first dielectric layer 124 may use nitride, but the disclosure is not limited thereto.

Figure 1C:
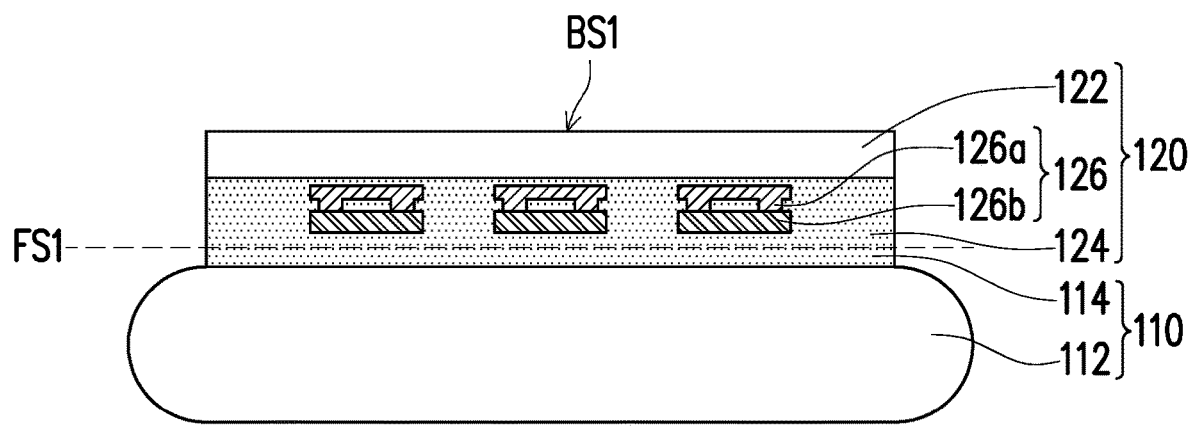

Referring to FIG. 1C, after the bonding interface FS1 is formed, a thinning process such as a backside grinding process or a CMP process is then performed to remove a portion of the backside BS1 of the first substrate 122. It should be note that, a thickness of the first substrate 122 may be adjusted depending on the requirements on the actual design, the disclosure is not limited thereto.

Figure 1D:
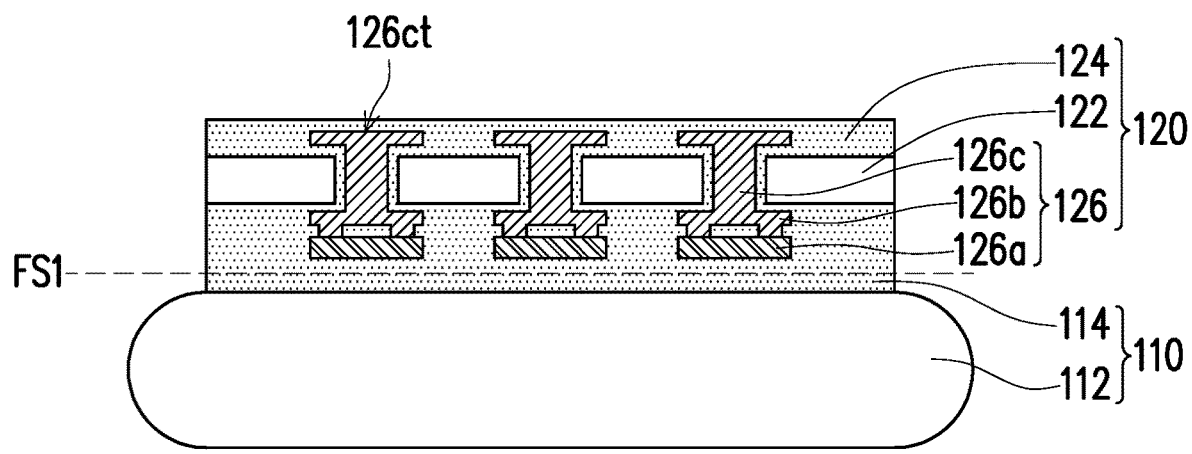

Referring to FIG. 1D, a vertical connector 126c is formed, wherein the vertical connector 126c may be penetrated through the first substrate 122. On the other hand, a dielectric material is formed to surround the vertical connector 126c, such that the dielectric material regrowth the first dielectric layer 124 to totally cover a top surface 126ct of the vertical connector 126c. In some embodiments, the vertical connector 126c may be a through-silicon via (TSV), and the via fabrication processes such as via-last fabrication techniques may alternatively be used, but the disclosure is not limited thereto, any suitable via fabrication process may be used, and all such processes are fully intended to be included within the scope of the embodiments discussed herein.

Figure 1E:
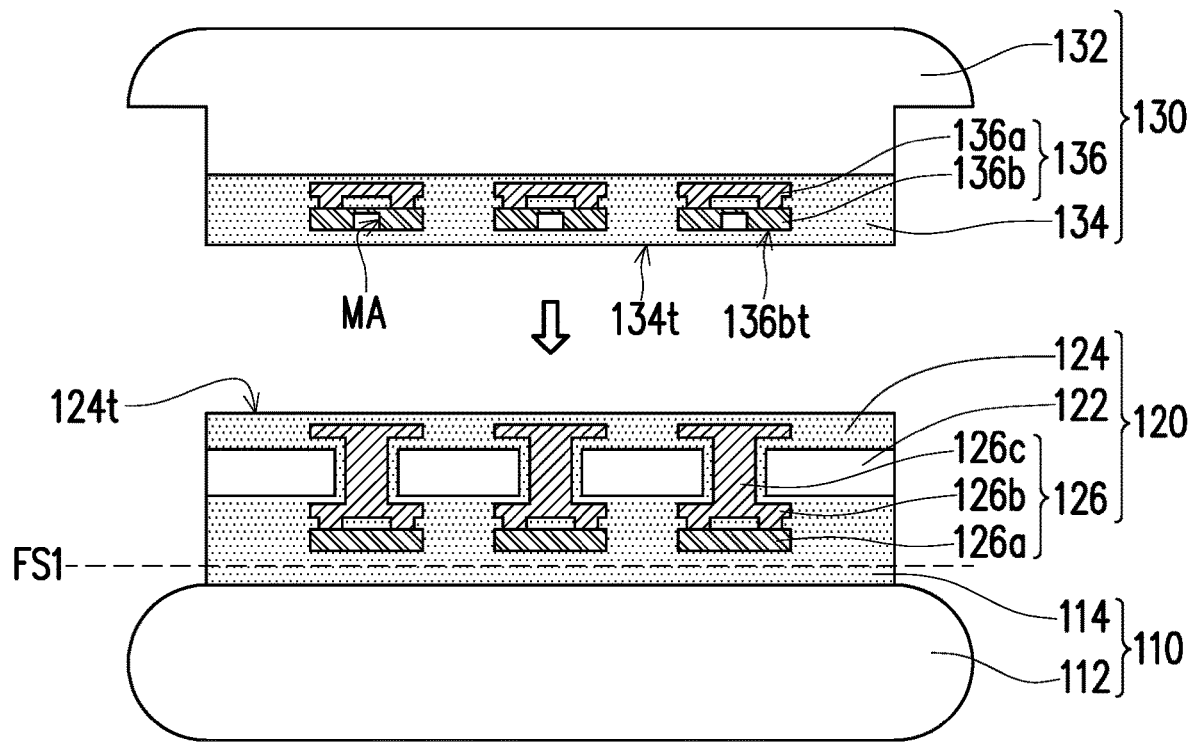

Referring to FIG. 1E, a second device wafer 130 is provided. The second device wafer 130 may be a memory device wafer, such as a DRAM or the like, in other words, the first device wafer 120 and the second device wafer 130 are the same kind of device wafer, such that the semiconductor device 100 may be homogeneous in functionality. In addition, the second device wafer 130 may include a second substrate 132, a second dielectric layer 134 formed on the second substrate 132, and at least one second connector 136 (three is shown but not limited) formed on the second substrate 132 and surrounded by the second dielectric layer 134 to avoid current leakage. The second substrate 132 may be a doped bulk silicon, an undoped bulk silicon, or an active layer of a semiconductor-on-insulator (SOI) substrate, and may include various layers that are not separately depicted and that combine to form various microelectronic elements, doped regions and isolation features, not shown. The second dielectric layer 134 may include a dielectric material, such as silicon nitride, silicon oxide, silicon carbon nitride or a combination thereof by any suitable method, such as CVD, ALD, or the like, but the disclosure is not limited thereto. Moreover, the second connector 136 may include a conductive pattern 136a and a conductive pad 136b formed on the conductive pattern 136a, wherein the conductive pattern 136a and the conductive pad 136b are embedded in the second dielectric layer 134, and the conductive pattern 136a and the conductive pad 136b can use suitable process to form, the disclosure is not limited thereto. Furthermore, a surface 136bt of the conductive pad 136b may be buried in the second dielectric layer 134, such that only dielectric surface (such as the surface 134t of the second dielectric layer 134) is exposed, but the disclosure is not limited thereto. In some embodiments, the conductive pattern 136a may include copper (Cu) or other suitable material, and the conductive pad 136b includes aluminum (Al) or other suitable material, but the disclosure is not limited thereto.

In some embodiments, the conductive pad 136b may have a hole MA so that subsequent connectors may be more efficiently aligned, as shown in FIG. 1E. Moreover, in a top view, a shape of the hole MA may be a circular (not shown), and a diameter of the hole MA may be 3 micrometers, but the disclosure is not limited thereto. The hole MA may be used any suitable process to form.

In some embodiments, for decreasing the breakage at the edge of substrate in the subsequent processes, a trimming process may be applied. For example, the trimming process is performed on the substrate 132 of the second device wafer 130 to adjust a shape of the edge, therefore, the stress accumulated on a corner of the substrate 132 of the second device wafer 130 will reduce in the subsequent processes, but the disclosure is not limited thereto.

Figure 1F:
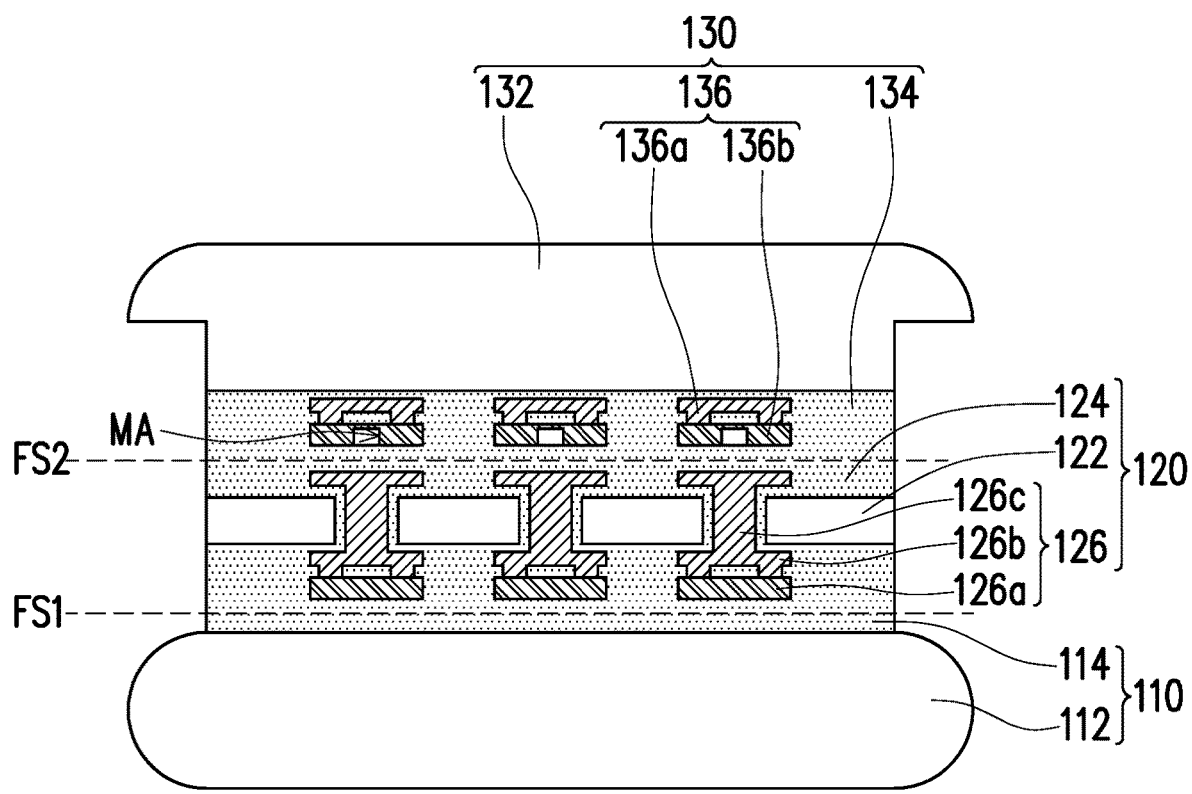

Referring to FIG. 1E and FIG. 1F, bonding the second device wafer 130 to the first device wafer 120, such that a bonding interface FS2 including a fusion-bonding interface is formed between the first device wafer 120 and the second device wafer 130. Moreover, the second device wafer 130 may direct contact the first device wafer 120. For example, the second dielectric layer 134 directly contacts the first dielectric layer 124, that is, the bonding interface FS2 is formed by a portion of the first dielectric layer 124 and a portion of the second dielectric layer 134. In some embodiments, there is no metal contact between the second device wafer 130 and the first device wafer 120, but the disclosure is not limited thereto.

In fusion bonding process, a surface of the dielectric layer is smooth and clean, therefore, before the fusion-bonding process, a polishing process or a cleaning process may be applied. For example, the cleaning process performs a wet clean to activate a surface 124t of the first dielectric layer 124 and a surface 134t of the second dielectric layer 134 to form the hydrophilic surface and to clean the surface of the surface 124t (bonding surface) and the surface 134t (bonding surface), such as a metal particle or an impurity existing on the surface 124t and/or the surface 134t are removed, therefore, a bonding reliability will be improved, but the disclosure is not limited thereto.

In some embodiments, the material of the second dielectric layer 134 and the material of the first dielectric layer 124 are used the same material, such as oxide, therefore, bonding interface FS2 is formed by oxide-to-oxide bond, but the disclosure is not limited thereto. In some embodiments, the material of the second dielectric layer 134 and the material of the first dielectric layer 124 are not used the same material, for example, the material of the second dielectric layer 134 may use oxide, and the material of the first dielectric layer 124 may use nitride, but the disclosure is not limited thereto.

Figure 1G:
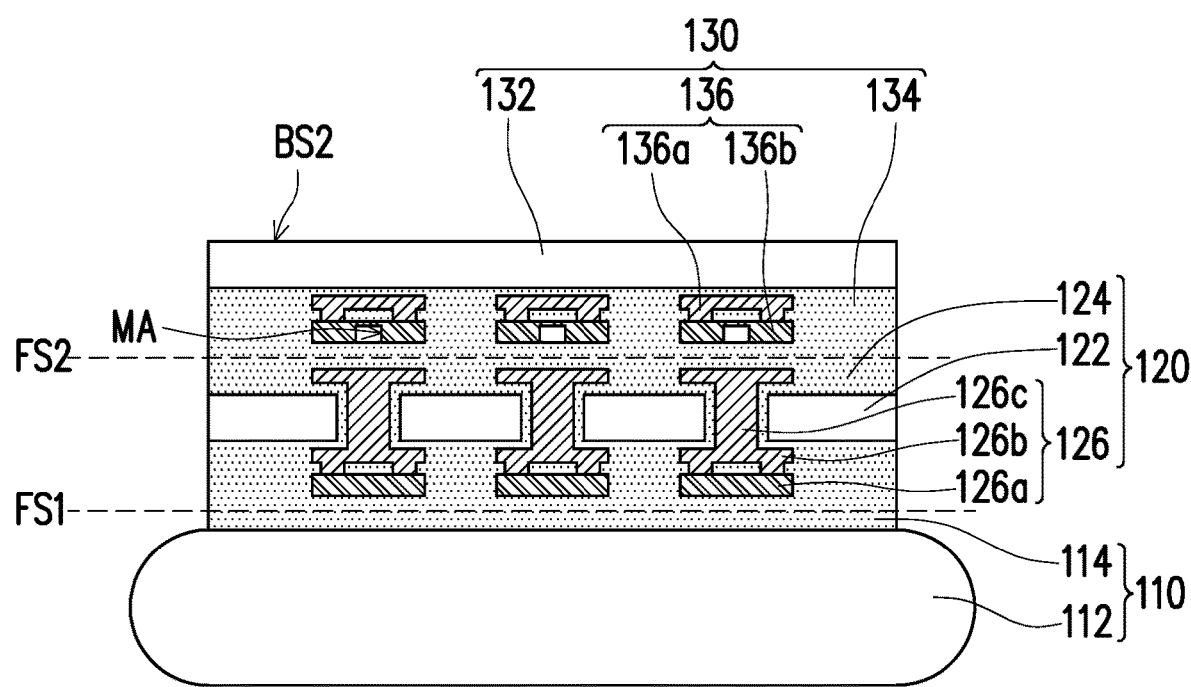

Referring to FIG. 1G, after bonding interface FS2 is formed, a thinning process such as the backside grinding process or the CMP process is then performed to remove a portion of the backside BS2 of the second substrate 132. It should be note that, a thickness of the second substrate 132 may be adjusted depending on the requirements on the actual design, the disclosure is not limited thereto.

Figure 1H:
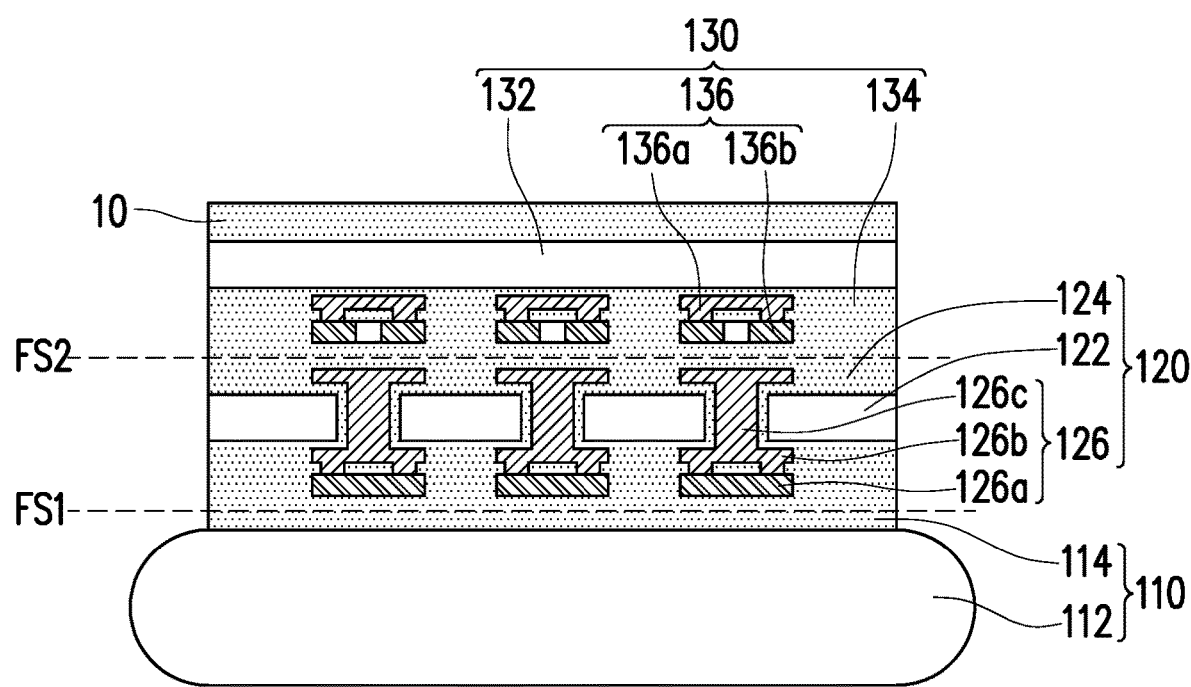

Referring to FIG. 1H, a dielectric material layer 10 is formed on the second substrate 132, wherein dielectric material layer 10 may become a part of the second dielectric layer 134 of the second device wafer 130 in the subsequent process. The dielectric material layer 10 may include a dielectric material, such as silicon nitride, silicon oxide, silicon carbon nitride or a combination thereof by any suitable method, such as CVD, ALD, or the like, but the disclosure is not limited thereto.

Figure 1I:
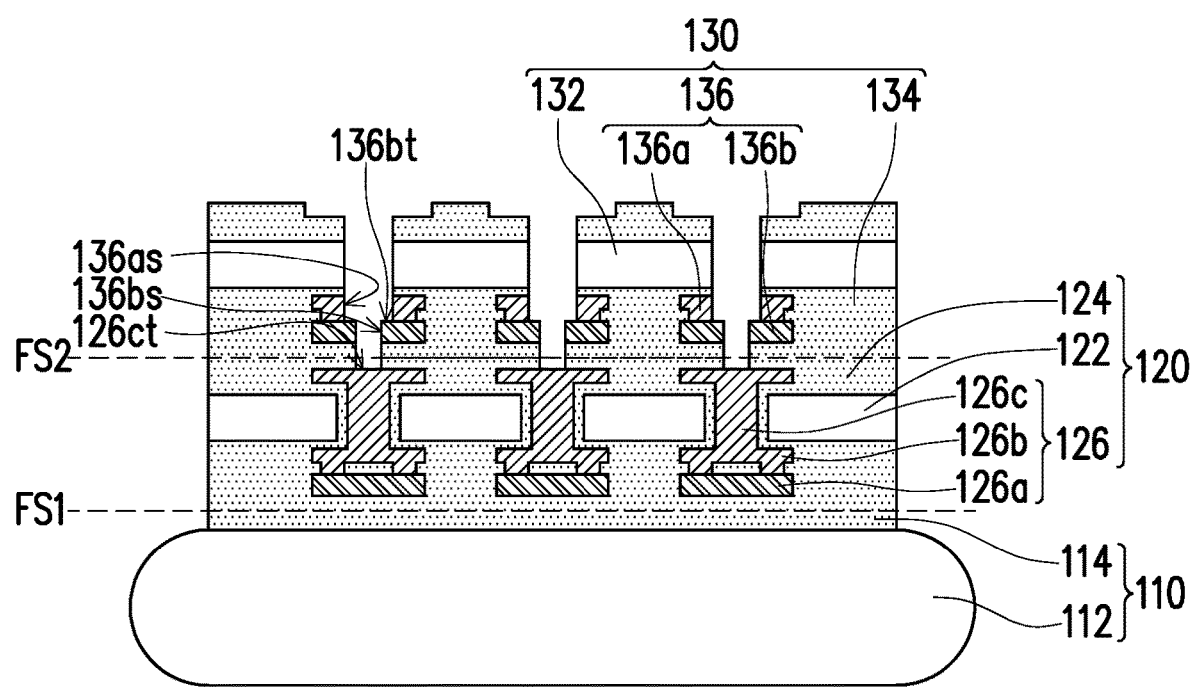
Figure 1J:
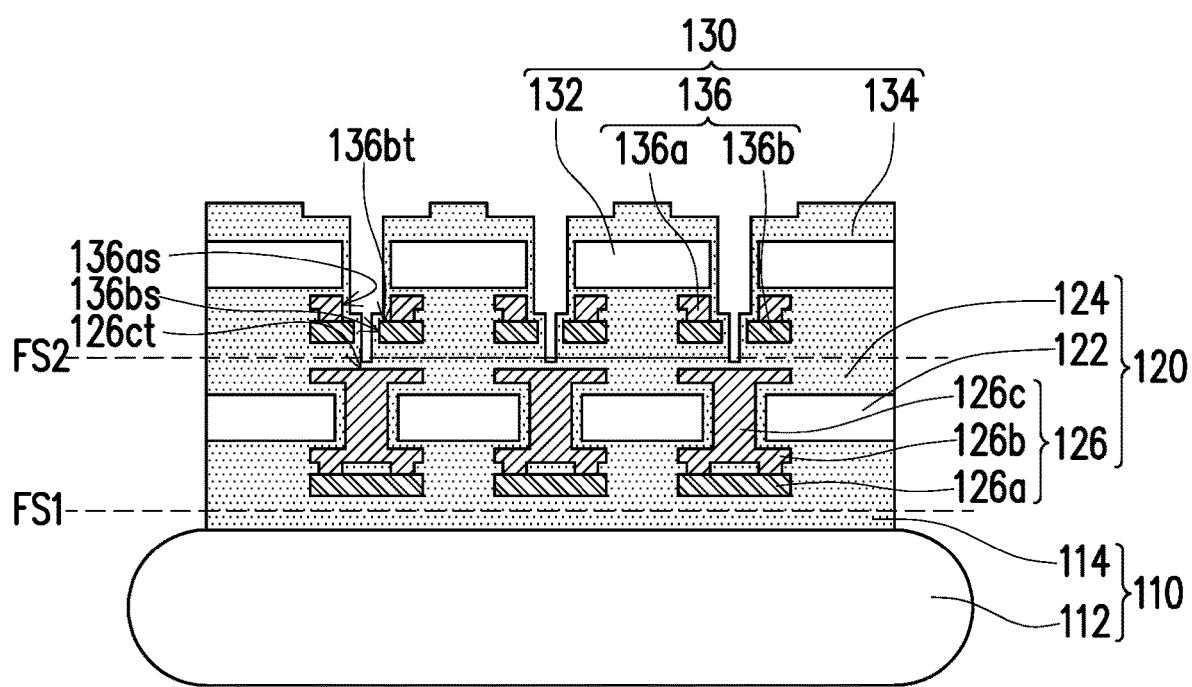
Figure 1K:
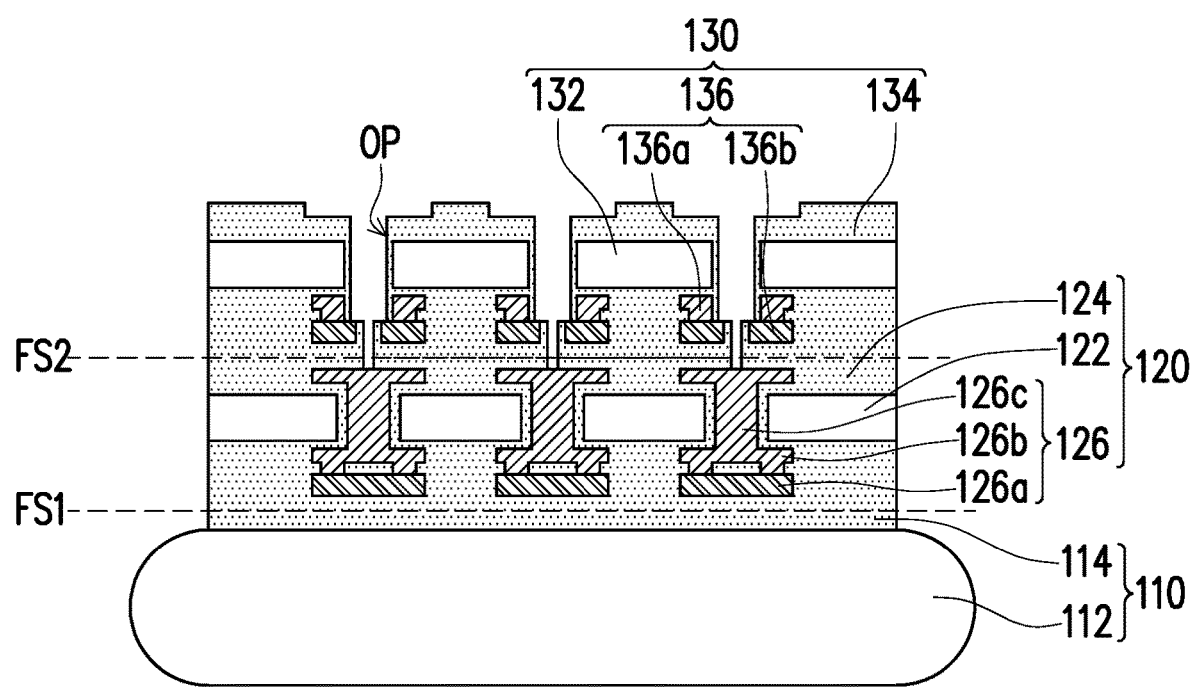

Referring to FIG. 1I to FIG. 1K, an opening OP is formed, wherein the opening OP may penetrate through the bonding interface FS2 to expose a portion of the second device wafer 130 and a portion of the first device wafer 120, as shown in FIG. 1K. The opening OP may be formed by the following steps. First, portion of the second device wafer 130 and portion of the first device wafer 120 are removed by etching process, therefore, a sidewall 136 as of the conductive pattern 136a, a top surface 136bt of the conductive pad 136b, a sidewall 136bs of the conductive pad 136b, and the top surface 126ct of the vertical connector 126c may be exposed, as shown in FIG. 1I. Then, a dielectric material may be conformally formed on the first device wafer 120 and the second device wafer 130, as shown in FIG. 1J, such that the dielectric material regrowth the first dielectric layer 124 and the second dielectric layer 134. Next, a punching process is performed to form the opening OP, such that a top surface of a conductive portion (a top surface 126ct of the vertical connector 126c) of the first device wafer 120 and a top surface of a conductive portion (a top surface 136bt of the conductive pad 136b) of the second device wafer 130 may be exposed, therefore, the conductive portion (a top surface 126ct of the vertical connector 126c) of the first device wafer 120 and the conductive portion (a top surface 136bt of the conductive pad 136b) of the second device wafer 130 may be used for subsequent electrical connections. On the other hand, the sidewall 136as of the conductive pattern 136a may be covered by the second dielectric layer 134.

Figure 1L:
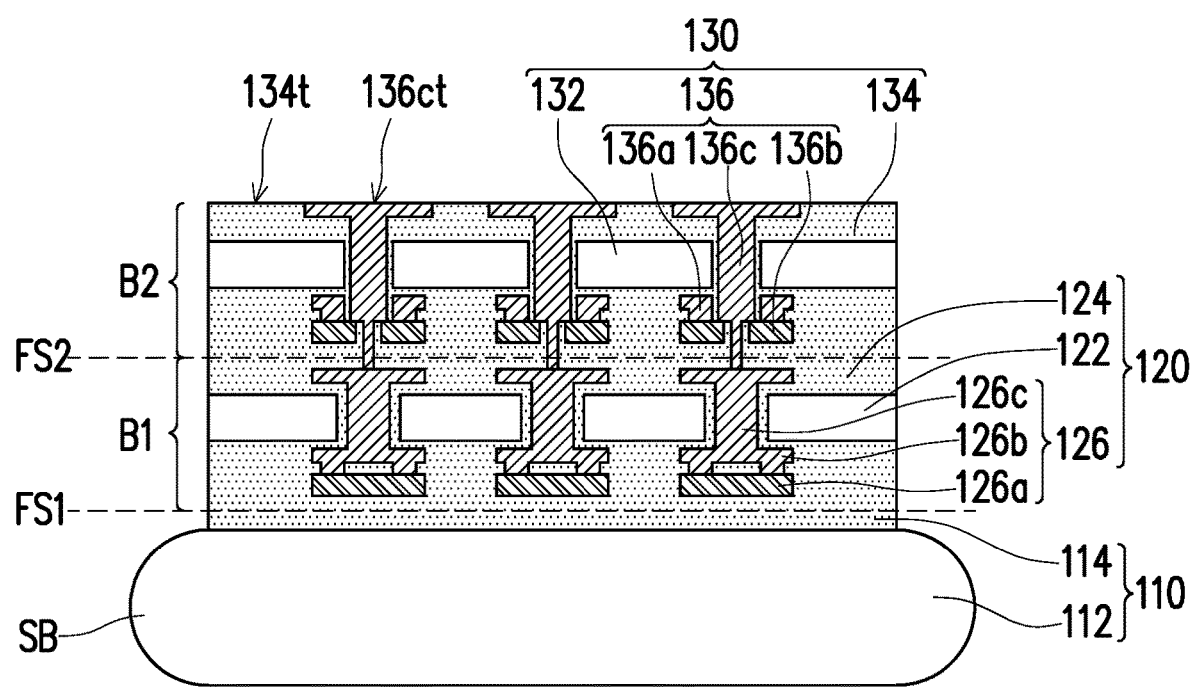

Referring to FIG. 1L, after the opening OP is formed, a conductive metal is filled in the opening OP to form a vertical connector 136c, and the second device wafer 130 are electrically coupled to the first device wafer 120 through the vertical connector 136c, wherein the vertical connector 136c may be a part of the second connector 136, and the vertical connector 136c may be a through-silicon via (TSV). The conductive metal may include copper (Cu) or other suitable material by any suitable method, such as plating, or the like, but the disclosure is not limited thereto. The manufacture of the semiconductor device 100 of the embodiment may be substantially completed after the above manufacturing process. The semiconductor device 100 includes a substrate SB, a first stacking unit B1 and a second stacking unit B2. The first stacking unit B1 is disposed on the substrate SB and including a dielectric layer (such as the first dielectric layer 124) and a conductive component (such as the vertical connector 126c). The second stacking unit B2 is disposed on the first stacking unit B1 and including a dielectric layer (such as second dielectric layer 134) and a conductive component (such as the conductive pad 136b and the vertical connector 136c). Moreover, a dielectric layer (such as the first dielectric layer 124) of first stacking unit B1 directly contacts a dielectric layer (such as second dielectric layer 134) of second stacking unit B2, and the conductive component (such as the vertical connector 136c) of first stacking unit B1 and a first portion of the conductive component (such as the conductive pad 136b) of second stacking unit B2 are separated by a distance and are electrically coupled by a second portion of the conductive component (such as the vertical connector 136c) of second stacking unit B2.

Accordingly, in aforementioned process at least including bonding the second device wafer 130 to the first device wafer 120, such that a bonding interface FS2 including a fusion-bonding interface is formed between the first device wafer 120 and the second device wafer 130, that is, no de-bonding layer (temporary layer) during process and a plurality of processes (such as de-bonding process, flipped upside down process and micro-mump bonding process) are omitted, on the other hand, a thickness of the device wafer may be decrease to increase density of the semiconductor device 100 (z-height of product), such that the costs are reduced, and favorable electrical performance and reliability of the high-density semiconductor device 100 are guaranteed. In some embodiments, the thickness of every device wafer may be smaller than 10 micrometers, but the disclosure is not limited thereto. Moreover, the conductive component (such as the vertical connector 136c) of first stacking unit B1 and a first portion of the conductive component (such as the conductive pad 136b) of second stacking unit B2 are separated by a distance and are electrically coupled by a second portion of the conductive component (such as the vertical connector 136c) of second stacking unit B2, hence, the semiconductor device 100 may have short vertical connecting route to improve the performance.

In some embodiments, optionally, a top surface 134t of the second dielectric layer 134 and a top surface 136ct of the vertical connector 136c may be coplanar, therefore, the vertical connector 136c may be electrically coupled to other elements in subsequent, but the disclosure is not limited thereto, in another embodiments, the vertical connector 126c may be embedded in the second dielectric layer 134 for stacking another device wafer.

In some embodiments, the semiconductor device 100 may be a memory stack, such as a DRAM stack, but the disclosure is not limited thereto.

In some embodiments, the second portion of the conductive component (such as the vertical connector 136*c*) of second stacking unit B2 may be directly contact a top surface of the conductive component (such as the vertical connector 136*c*) of first stacking unit B1 and a top surface of the first portion of the conductive component (such as the conductive pad 136*b*) of second stacking unit B2, but the disclosure is not limited thereto.

In some embodiments, the second portion of the conductive component (such as the vertical connector 136*c*) of second stacking unit B2 may penetrate through the first portion of the conductive component (such as the conductive pad 136*b*) of second stacking unit B2, but the disclosure is not limited thereto.

It should be noted herein that the reference numerals of components and some contents in the foregoing embodiments also apply in the following embodiments, where the same reference numerals are used to denote the same or similar components, and the descriptions of the same technical contents are omitted. For the description of the omitted part, reference can be made to the foregoing embodiments, and the details are not described in the following embodiments again.

FIG. 2A to FIG. 2H are schematic cross sectional views illustrating various stages in a manufacturing method of a semiconductor device according to some embodiments of the disclosure. The semiconductor device 200 of this embodiment is similar to the semiconductor device 100 of the first embodiment, in which similar elements are denoted by the same reference numerals and are assumed to have similar functions, materials or forming methods, so the descriptions thereof are omitted hereinafter.

Figure 2A:
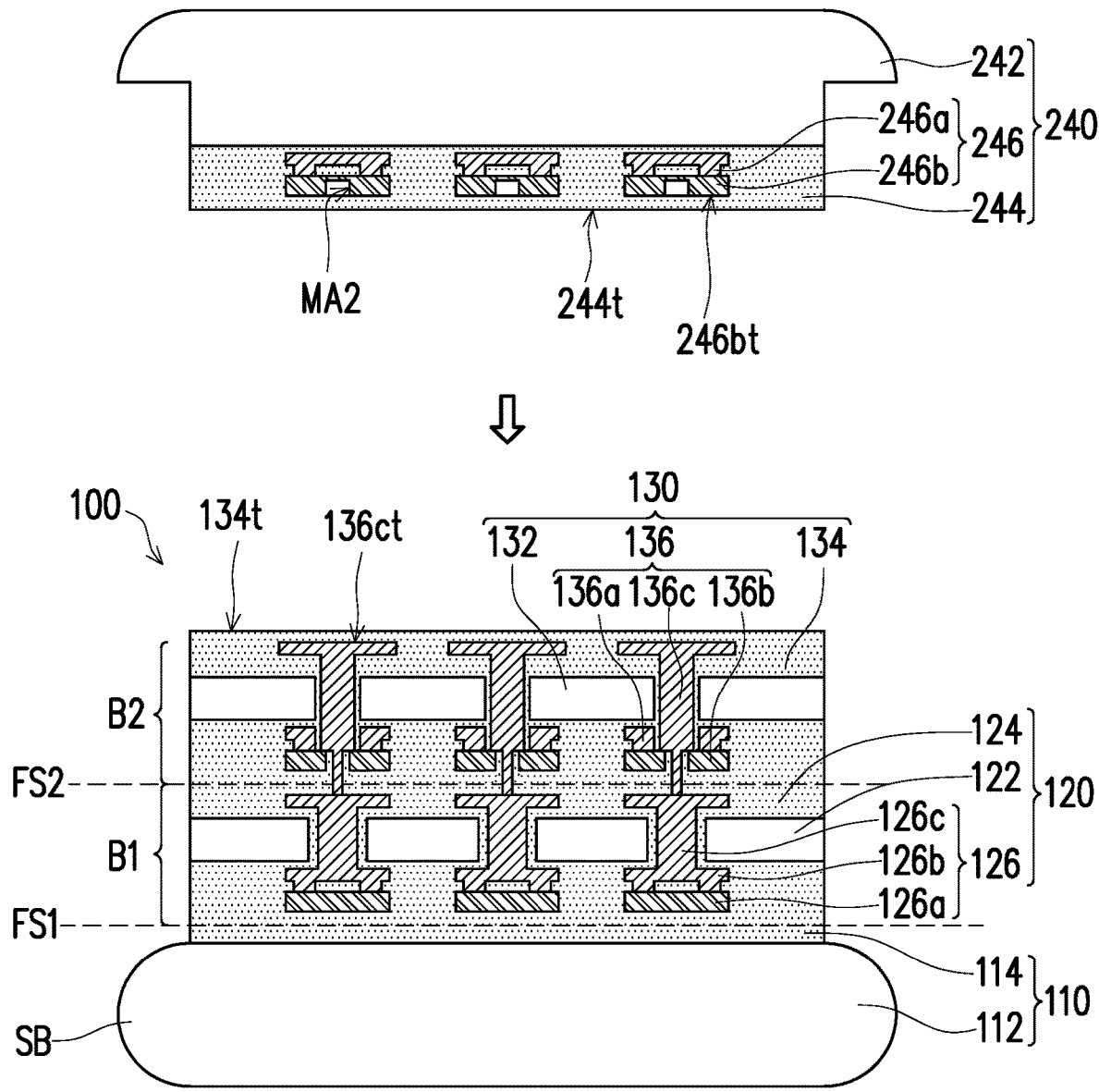
FIG. 2A to FIG. 2H are schematic cross sectional views illustrating various stages in a manufacturing method of a semiconductor device according to some embodiments of the disclosure.

Referring to FIG. 2A, following the step of FIG. 1L, the second dielectric layer 134 may be totally covered a top surface 136*ct* of the vertical connector 136*c*. On the other hand, a third device wafer 240 is provided. The third device wafer 240 may be a memory device wafer, such as a DRAM or the like, in other words, the first device wafer 120, the second device wafer 130, and the third device wafer 240 are the same kind of device wafer, such that the semiconductor device 200 may be homogeneous in functionality. In addition, the third device wafer 240 may include a third substrate 242, a third dielectric layer 244 formed on the third substrate 242, and at least one third connector 246 (three is shown but not limited) formed on the third substrate 242 and surrounded by the third dielectric layer 244 to avoid current leakage. The third substrate 242 may be a doped bulk silicon, an undoped bulk silicon, or an active layer of a semiconductor-on-insulator (SOI) substrate, and may include various layers that are not separately depicted and that combine to form various microelectronic elements, doped regions and isolation features, not shown. The third dielectric layer 244 may include a dielectric material, such as silicon nitride, silicon oxide, silicon carbon nitride or a combination thereof by any suitable method, such as CVD, ALD, or the like, but the disclosure is not limited thereto. Moreover, the third connector 246 may include a conductive pattern 246*a* and a conductive pad 246*b* formed on the conductive pattern 246*a*, wherein the conductive pattern 246*a* and the conductive pad 246*b* are embedded in the third dielectric layer 244, and the conductive pattern 246*a* and the conductive pad 246*b* can use suitable process to form, the disclosure is not limited thereto. Furthermore, a surface 246*bt* of the conductive pad 246*b* may be buried in the third dielectric layer 244, such that only dielectric surface (such as the surface 244*t* of the third dielectric layer 244) is exposed, but the disclosure is not limited thereto. In some embodiments, the conductive pattern 246*a* may include copper (Cu) or other suitable material, and the conductive pad 246*b* includes aluminum (Al) or other suitable material, but the disclosure is not limited thereto.

In some embodiments, the conductive pad 246*b* may have a hole MA2 so that subsequent connectors may be more efficiently aligned, as shown in FIG. 2A. Moreover, in a top view, a shape of the hole MA2 may be a circular (not shown), and a diameter of the hole MA2 may be 3 micrometers, but the disclosure is not limited thereto. The hole MA2 may be used any suitable process to form.

In some embodiments, for decreasing the breakage at the edge of substrate in the subsequent processes, a trimming process may be applied. For example, the trimming process is performed on the third substrate 242 of the third device wafer 240 to adjust a shape of the edge, therefore, the stress accumulated on a corner of the third substrate 242 of the third device wafer 240 will reduce in the subsequent processes, but the disclosure is not limited thereto.

Figure 2B:
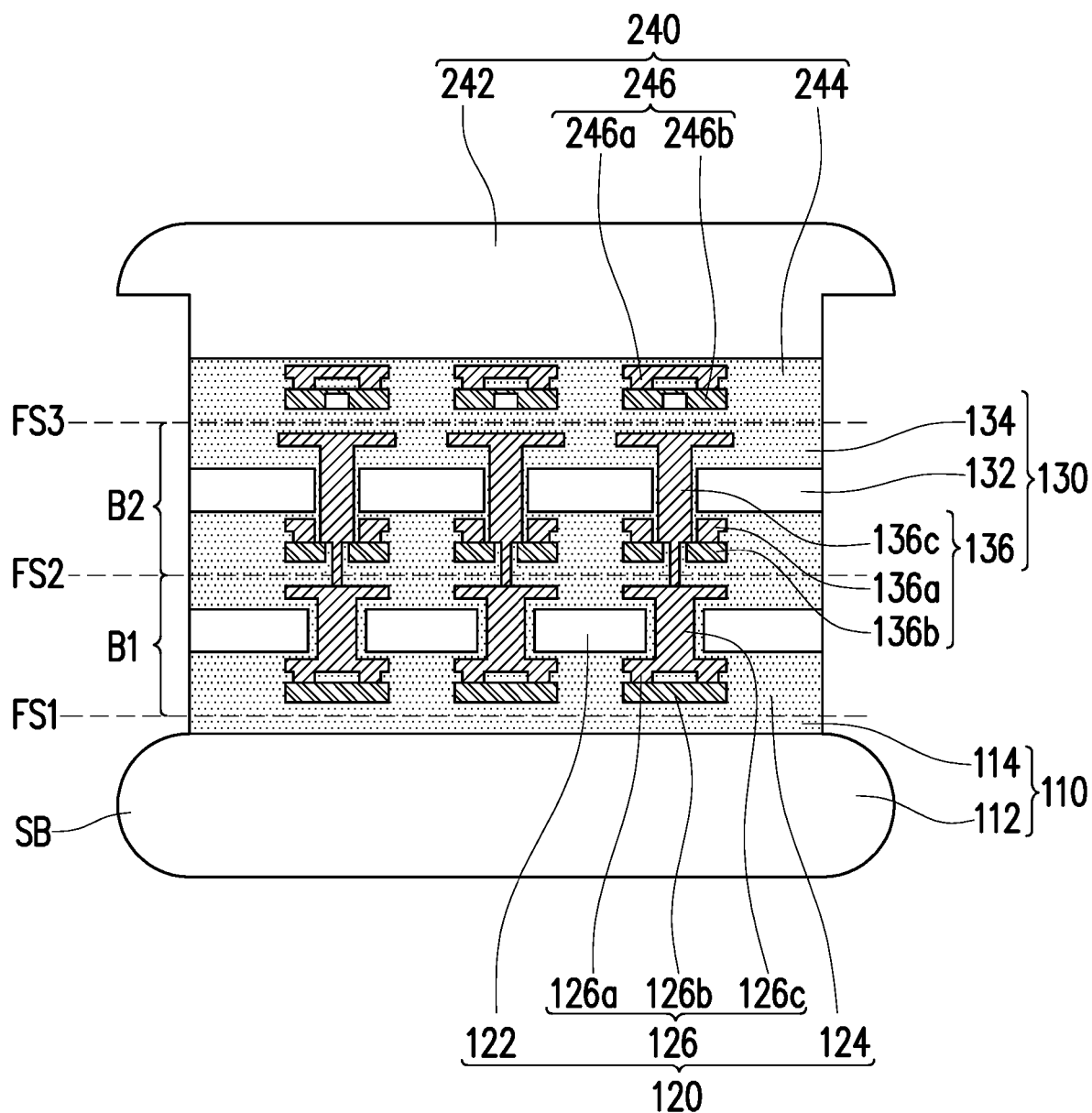

Referring to FIG. 2A and FIG. 2B, bonding the third device wafer 240 to the second device wafer 130, such that a bonding interface FS3 including a fusion-bonding interface is formed between the second device wafer 130 and the third device wafer 240. Moreover, the second device wafer 130 may direct contact the third device wafer 240. For example, the second dielectric layer 134 directly contacts the third dielectric layer 244, that is, the bonding interface FS3 is formed by a portion of the second dielectric layer 134 and a portion of the third dielectric layer 244. In some embodiments, there is no metal contact between the second device wafer 130 and the third device wafer 240, but the disclosure is not limited thereto.

In fusion bonding process, a surface of the dielectric layer is smooth and clean, therefore, before the fusion-bonding process, a polishing process or a cleaning process may be applied. For example, the cleaning process performs a wet clean to activate a surface 244*t* of third device wafer 240 and a surface 134*t* of the second device wafer 130 to form the hydrophilic surface and to clean the surface of the surface 244*t* (bonding surface) and the surface 134*t* (bonding surface), such as a metal particle or an impurity existing on the surface 110*s* and/or the surface 120*s* are removed, therefore, a bonding reliability will be improved, but the disclosure is not limited thereto.

In some embodiments, the material of the second dielectric layer 134 and the material of the third dielectric layer 244 are used the same material, such as oxide, therefore, bonding interface FS1 is formed by oxide-to-oxide bond, but the disclosure is not limited thereto. In some embodiments, the material of the second dielectric layer 134 and the material of the third dielectric layer 244 are not used the same material, for example, the material of the second dielectric layer 134 may use oxide, and the material of the third dielectric layer 244 may use nitride, but the disclosure is not limited thereto.

Figure 2C:
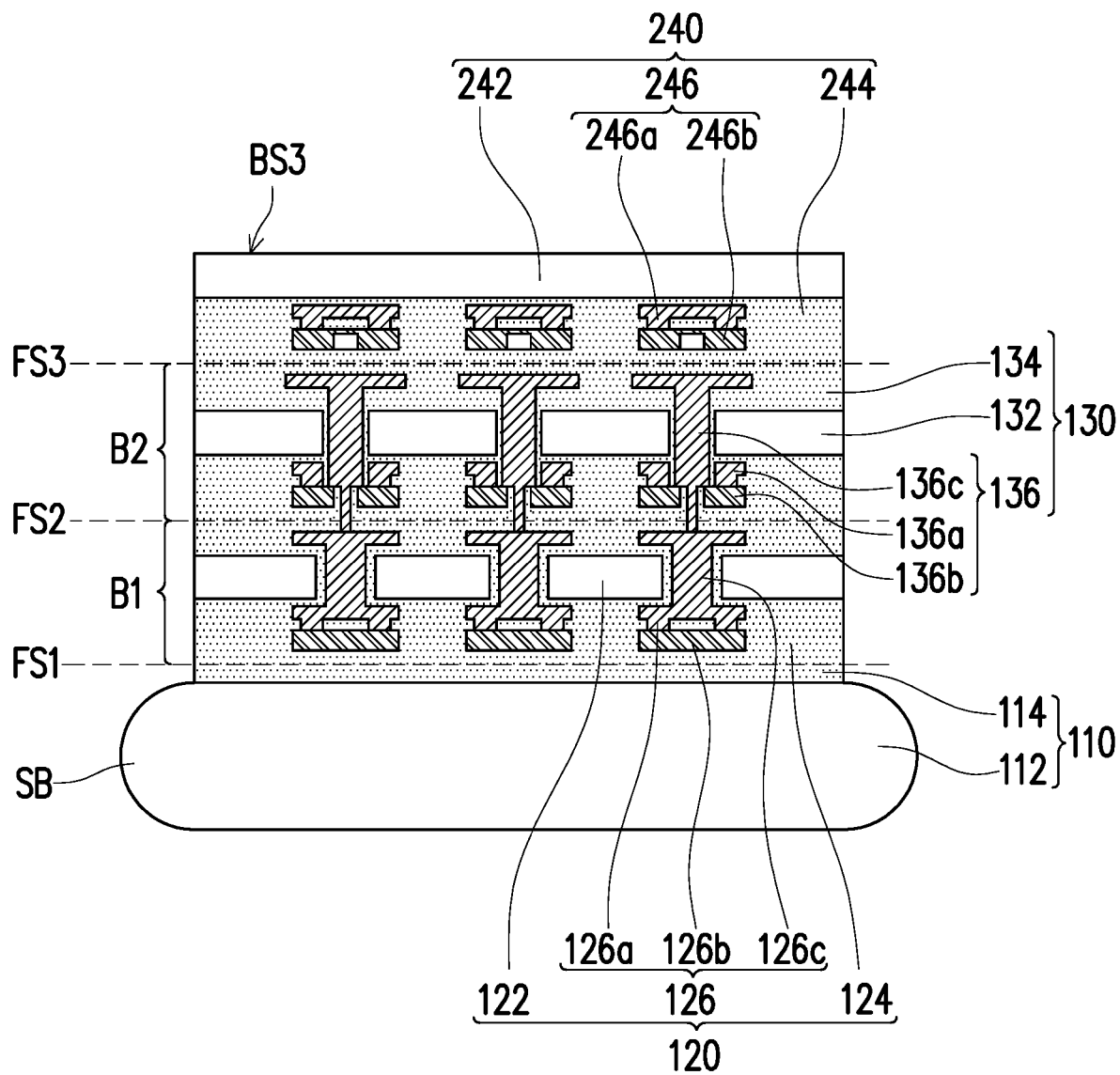

Referring to FIG. 2C, after bonding interface FS3 is formed, a thinning process such as the backside grinding process or the CMP process is then performed to remove portion of the backside BS3 of the third substrate 242. It should be note that, a thickness of the third substrate 242 may be adjusted depending on the requirements on the actual design, the disclosure is not limited thereto.

Figure 2D:
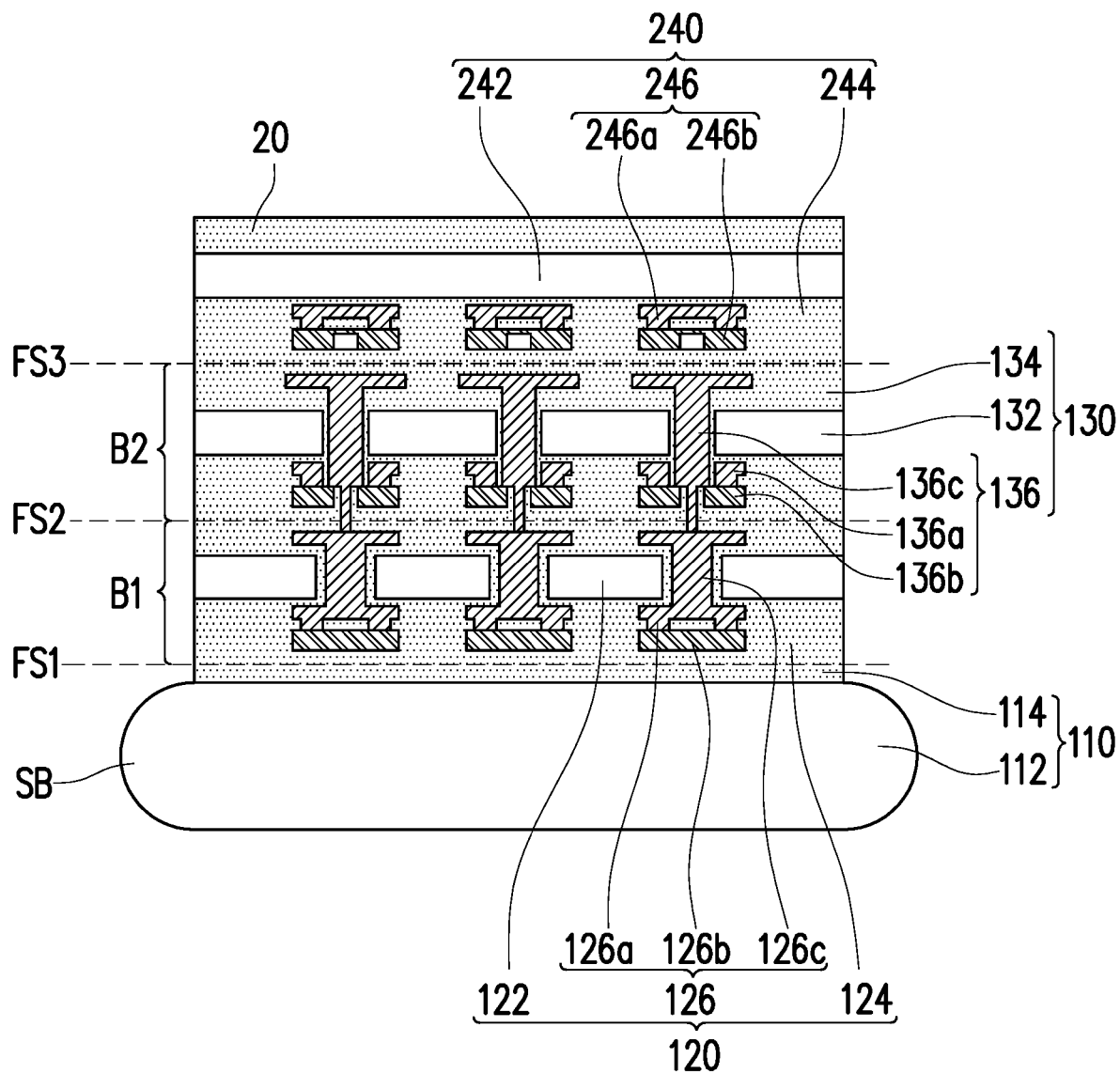

Referring to FIG. 2D, a dielectric material layer 20 is formed on the third substrate 242, wherein dielectric material layer 20 may become a part of the third dielectric layer 244 of the third device wafer 240 in the subsequent process. The dielectric material layer 20 may include a dielectric material, such as silicon nitride, silicon oxide, silicon carbon nitride or a combination thereof by any suitable method, such as CVD, ALD, or the like, but the disclosure is not limited thereto.

Figure 2E:
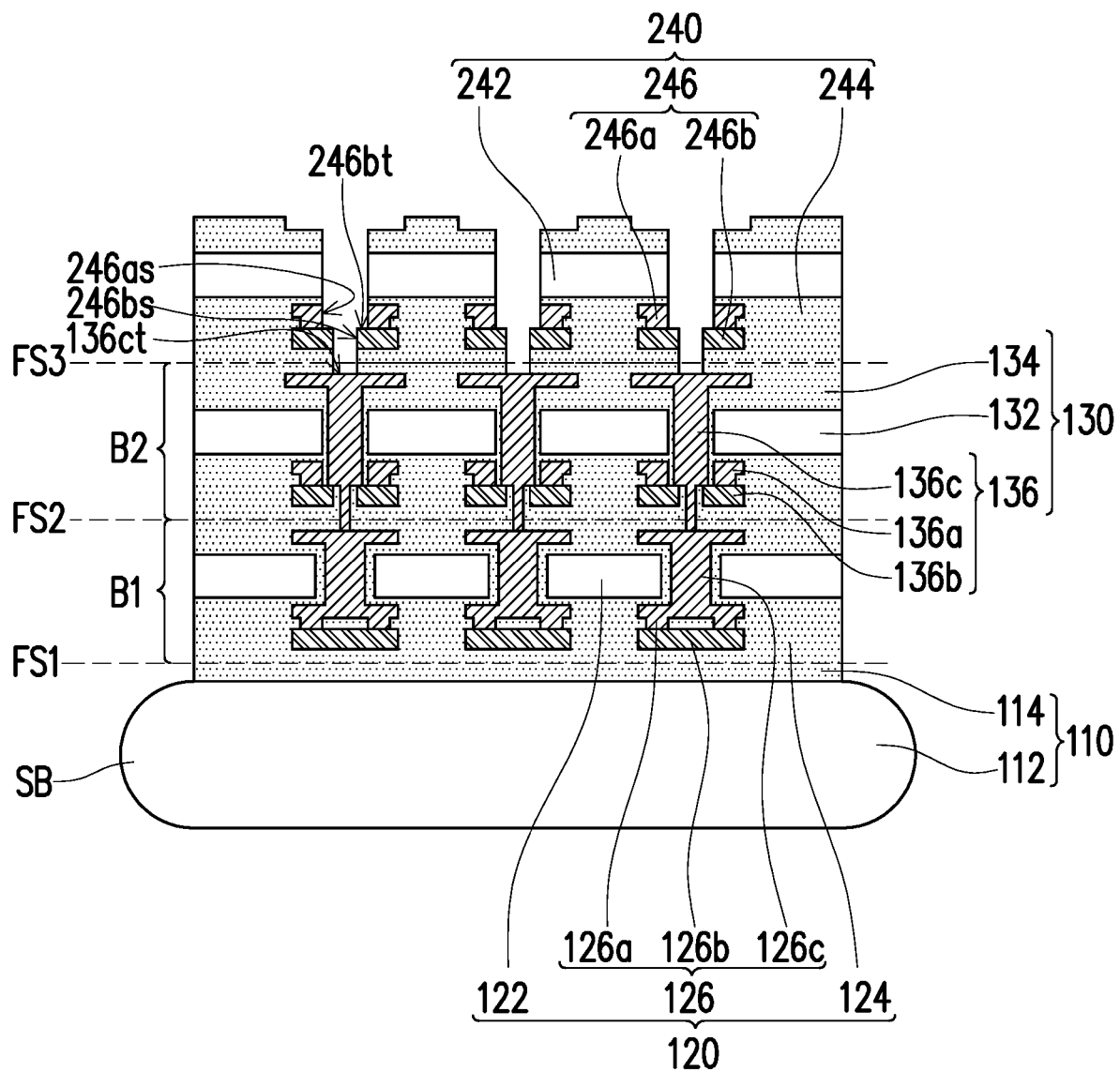
Figure 2F:
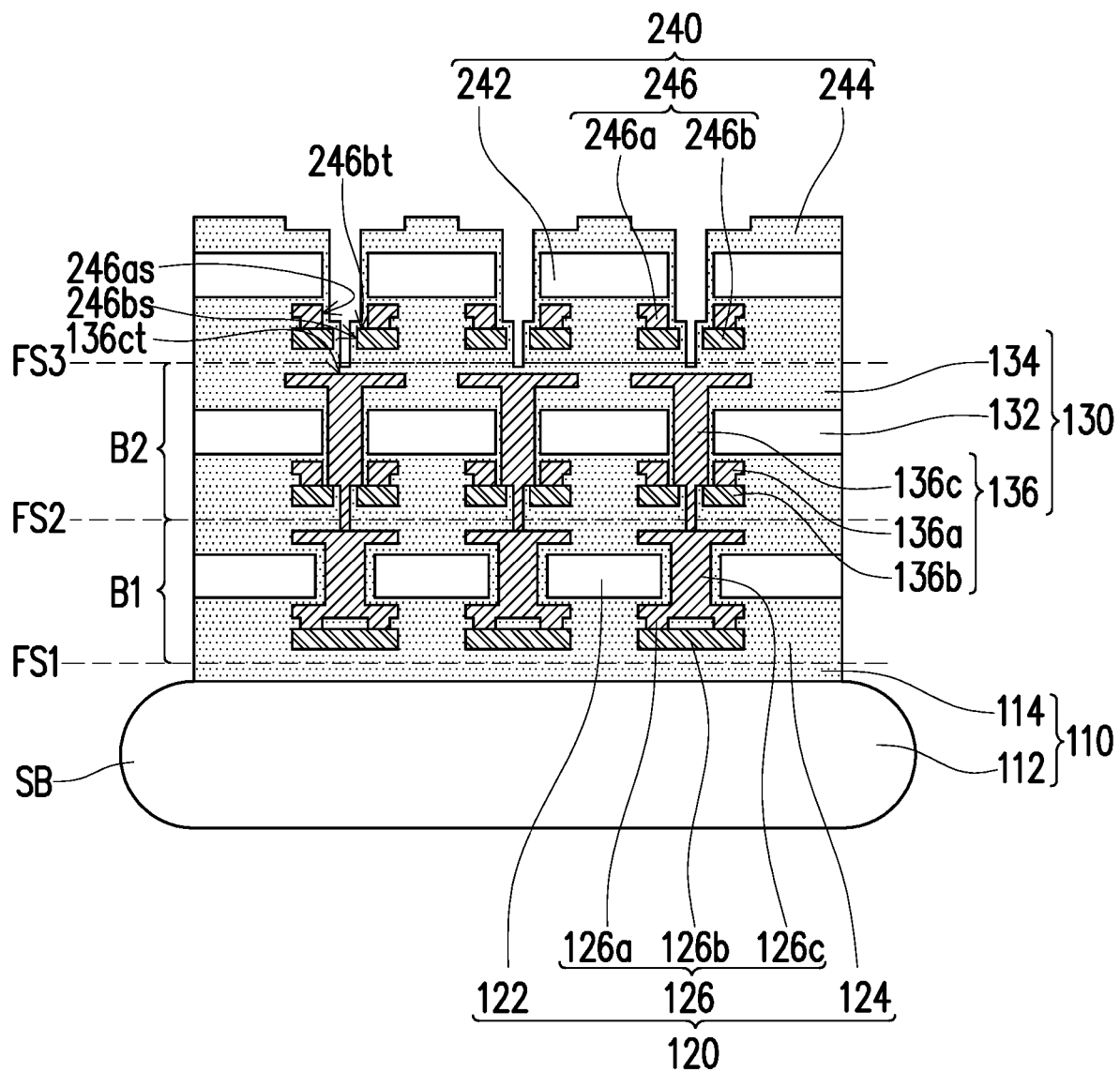
Figure 2G:
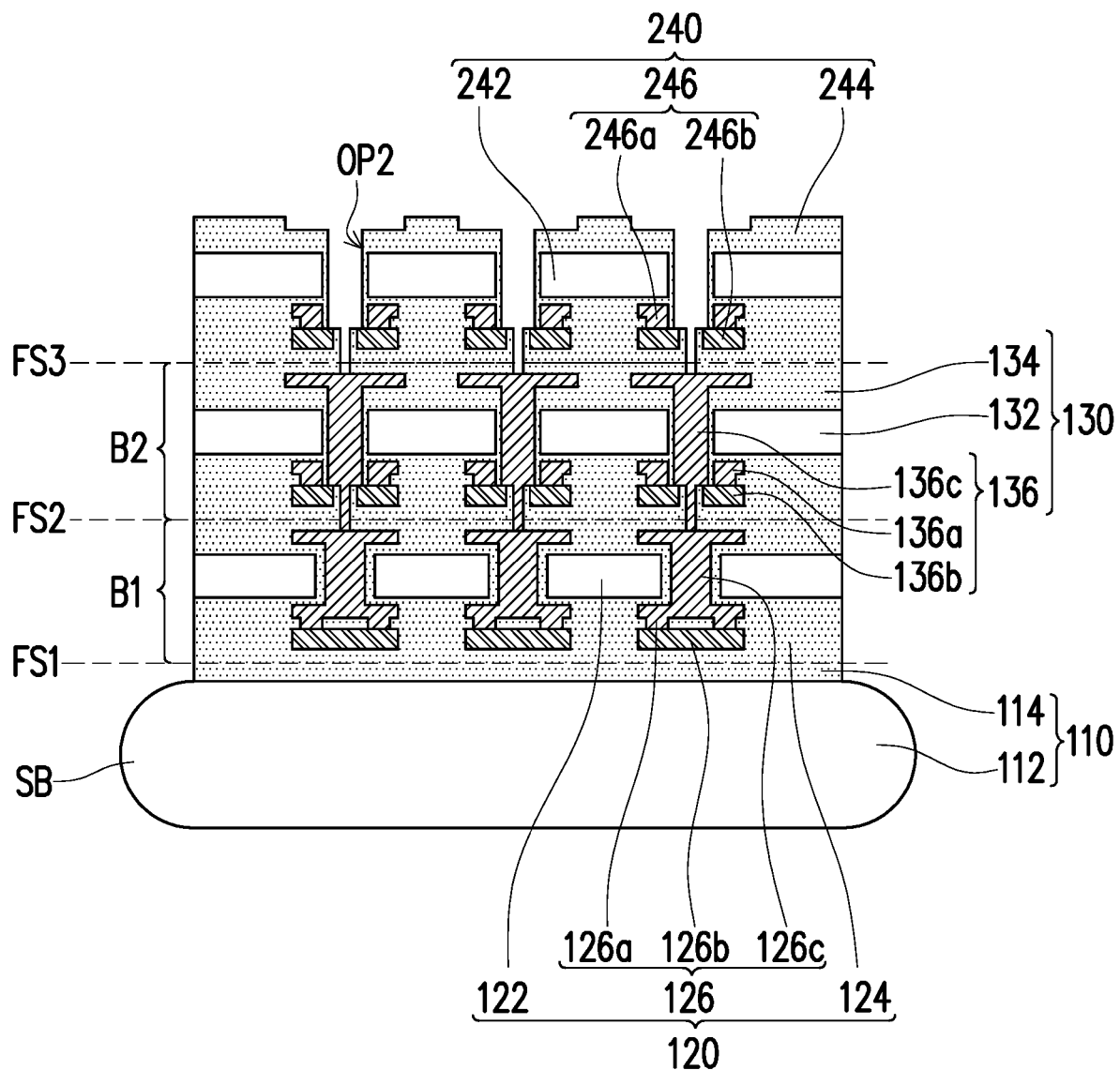

Referring to FIG. 2E to FIG. 2G, an opening OP2 is formed, wherein the opening OP2 may penetrate through the bonding interface FS3 to expose a portion of the second device wafer 130 and a portion of the third device wafer 240, as shown in FIG. 2G. The opening OP2 may be formed by the following steps. First, a portion of the third device wafer 240 and a portion of the second device wafer 130 are removed by etching process, therefore, a sidewall 246as of the conductive pattern 246a, a top surface 246bt of the conductive pad 246b, a sidewall 246bs of the conductive pad 246b, and the top surface 136ct of the vertical connector 136c may be exposed, as shown in FIG. 2E. Then, a dielectric material may be conformally formed on the second device wafer 130 and the third device wafer 240, as shown in FIG. 2F, such that the dielectric material regrowth the second dielectric layer 134 and the third dielectric layer 244. Next, a punching process is performed to form the opening OP2, such that a top surface of a conductive portion (a top surface 136ct of the vertical connector 136c) of the second device wafer 130 and a top surface of the conductive portion (a top surface 246bt of the conductive pad 246b) of the third device wafer 240 may be exposed, therefore, the conductive portion (a top surface 136ct of the vertical connector 136c) of the second device wafer 130 and a top surface of the conductive portion (a top surface 246bt of the conductive pad 246b) of the third device wafer 240 may be used for subsequent electrical connections. On the other hand, the sidewall 246as of the conductive pattern 246a may be covered by the third dielectric layer 244.

Figure 2H:
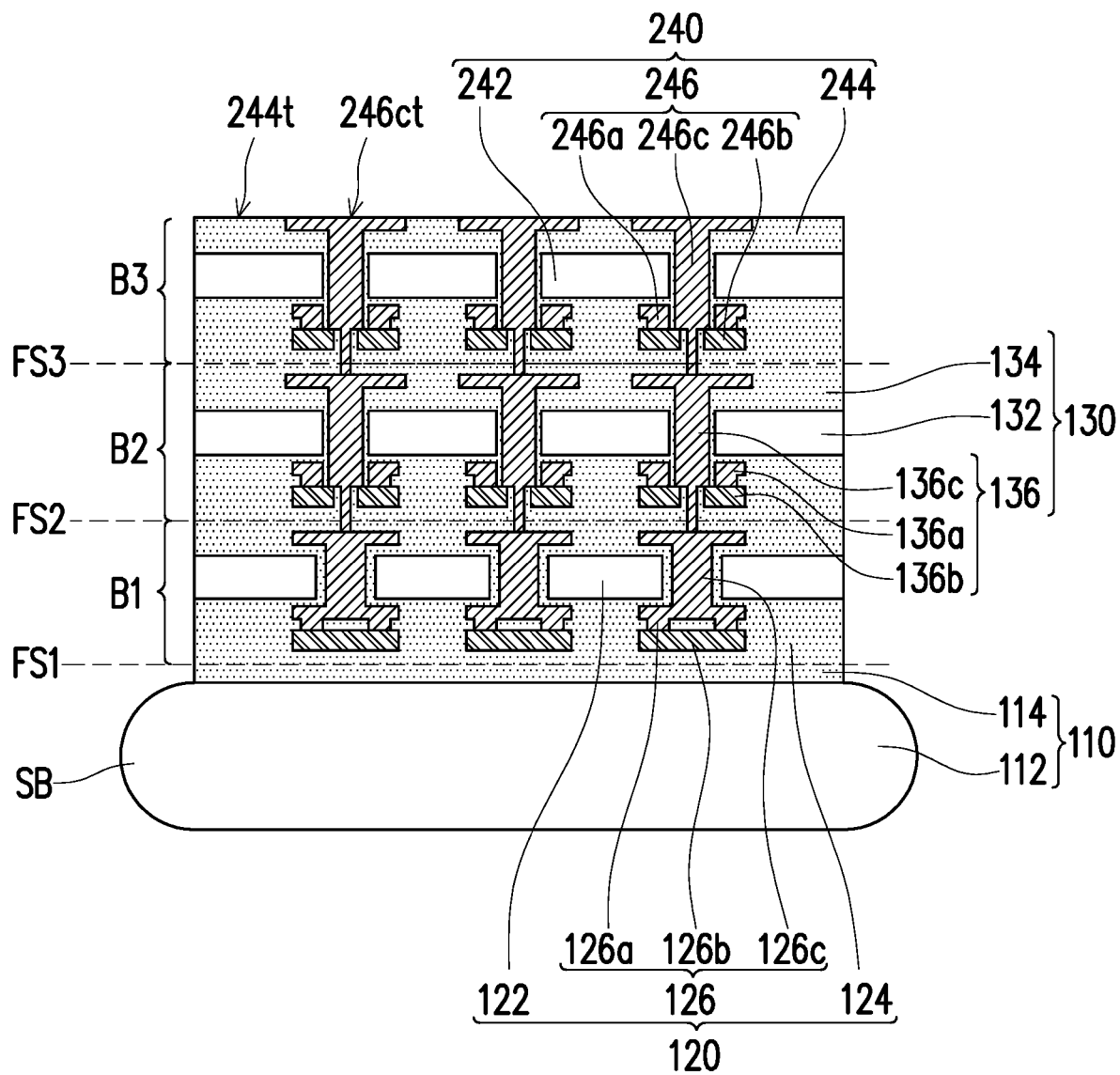

Referring to FIG. 2H, after the opening OP2 is formed, a conductive metal is filled in the opening OP2 to form a vertical connector 246c, and the second device wafer 130 are electrically coupled to the third device wafer 240 through the vertical connector 246c, wherein the vertical connector 246c may be a part of the third connector 246, and the vertical connector 246c may be a through-silicon via (TSV). The conductive metal may include copper (Cu) or other suitable material by any suitable method, such as plating, or the like, but the disclosure is not limited thereto. The manufacture of the semiconductor device 200 of the embodiment may be substantially completed after the above manufacturing process. The semiconductor device 200 includes a substrate SB, a first stacking unit B1, a second stacking unit B2, and a third stacking unit B3. In present embodiment, the first stacking unit B1 and the second stacking unit B2 may be similar to FIG. 1L, and the third stacking unit B3 is disposed on the second stacking unit B2 and including a dielectric layer (such as the third dielectric layer 244) and a conductive component (such as the conductive pattern 246a, the conductive pad 246b, and vertical connector 246c). Moreover, a dielectric layer (such as the third dielectric layer 244) of third stacking unit B3 directly contacts a dielectric layer (such as second dielectric layer 134) of second stacking unit B2, and the conductive component (such as the vertical connector 136c) of second stacking unit B2 and a first portion of the conductive component (such as the conductive pad 246b) of third stacking unit B3 are separated by a distance and are electrically coupled by a second portion of the conductive component (such as the vertical connector 246c) of third stacking unit B3.

Accordingly, in aforementioned process at least including bonding the third device wafer 240 to the second device wafer 130, such that a bonding interface FS3 including a fusion-bonding interface is formed between the second device wafer 130 and the third device wafer 240, that is, no de-bonding layer (temporary layer) during process and a plurality of processes (such as de-bonding process, flipped upside down process and micro-mump bonding process) are omitted, on the other hand, a thickness of the device wafer may be decrease to increase density of the semiconductor device 200 (z-height of product), such that the costs are reduced, and favorable electrical performance and reliability of the high-density semiconductor device 200 are guaranteed. In some embodiments, the thickness of every device wafer may be smaller than 10 micrometers, but the disclosure is not limited thereto. Moreover, the conductive component (such as the vertical connector 136c) of second stacking unit B2 and a first portion of the conductive component (such as the conductive pad 246b) of third stacking unit B3 are separated by a distance and are electrically coupled by a second portion of the conductive component (such as the vertical connector 246c) of third stacking unit B3, hence, the semiconductor device 200 may have short vertical connecting route to improve the performance. In present embodiments, number of stack device wafer are more, therefore, the performance will improve, but the disclosure is not limited thereto, and it may repeat the aforementioned process to form a semiconductor device stacking more device wafer.

In some embodiments, optionally, a top surface 244t of the third dielectric layer 244 and a top surface 246ct of the vertical connector 246c may be coplanar, therefore, the vertical connector 246c may be electrically coupled to other elements in subsequent, but the disclosure is not limited thereto, in another embodiments, the vertical connector 246c may be embedded in the third dielectric layer 244 for stacking another device wafer.

In some embodiments, the semiconductor device 200 may be a memory stack, such as a DRAM stack, but the disclosure is not limited thereto.

In some embodiments, the second portion of the conductive component (such as the vertical connector 246c) of third stacking unit B3 may be directly contact a top surface of the conductive component (such as vertical connector 136c) of second stacking unit B2 and a top surface of the first portion of the conductive component (such as the conductive pad 246b) of third stacking unit B3.

In some embodiments, the second portion of the conductive component (such as the vertical connector 246c) of third stacking unit B3 may penetrate through the first portion of the conductive component (such as the conductive pad 246b) of third stacking unit B3, but the disclosure is not limited thereto.

In some embodiments, the second portion of the conductive component (such as the vertical connector 246c) of third stacking unit B3 may be aligned with the second portion of the conductive component (such as the vertical connector 136c) of third stacking unit B2.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A method of manufacturing a semiconductor device, comprising:

bonding a second device wafer to a first device wafer, such that a first bonding interface including a fusion-bonding interface is formed between the first device wafer and the second device wafer, wherein the first device wafer and the second device wafer are the same kind of device wafer, wherein the first device wafer comprises a first dielectric layer and a first conductive portion, the second device wafer comprises a second dielectric layer and a second conductive portion, and the fusion bonding interface is formed by entire surfaces between the first dielectric layer and the second dielectric layer only;

forming an opening, wherein the opening penetrates through the first bonding interface to expose a portion of the second device wafer and a portion of the first device wafer, wherein the first conductive portion and the second conductive portion are exposed by the opening.

2. The method as claimed in claim 1, wherein the first dielectric layer directly contacts the second dielectric layer.

3. The method as claimed in claim 1, further comprising:

filling a conductive metal in the opening to form a vertical connector, and the second device wafer are electrically coupled to the first device wafer through the vertical connector.

4. The method as claimed in claim 1, wherein forming the opening includes:

performing a punching process to expose a top surface of the first conductive portion and a top surface of the second conductive portion.

5. The method as claimed in claim 1, further comprising:

bonding a third device wafer to the second device wafer, such that a second bonding interface including a fusion-bonding interface is formed between the second device wafer and the third device wafer, wherein the second device wafer and the third device wafer are the same kind of device wafer.

6. The method as claimed in claim 5, wherein the first device wafer, the second device wafer, and the third device wafer are memory device wafer.

7. The method as claimed in claim 5, wherein the third device wafer comprises a third dielectric layer, and the second dielectric layer directly contacts the third dielectric layer.

8. The method as claimed in claim 1, further comprising:

bonding the first device wafer to a dummy wafer, such that a third bonding interface including a fusion-bonding interface is formed between the dummy wafer and the first device wafer before the first bonding interface is formed.

9. The method as claimed in claim 8, wherein the dummy wafer comprises a dielectric material layer, and the dielectric material layer directly contacts the first dielectric layer.

* * * * *